United States Patent [19]

Murari et al.

[11] Patent Number: 5,412,248
[45] Date of Patent: May 2, 1995

[54] SEMICONDUCTOR DEVICE PACKAGE WITH SHAPED PARTS FOR DIRECT COUPLING TO STANDARD CONNECTORS

[75] Inventors: Bruno Murari, Monza; Giuseppe Libretti, Milan, both of Italy

[73] Assignee: SGS-Thomson Microelectronics, S.r.l., Agrate Brianza, Italy

[21] Appl. No.: 960,529

[22] Filed: Oct. 13, 1992

[30] Foreign Application Priority Data

Mar. 3, 1992 [EP] European Pat. Off. ............ 92830097

[51] Int. Cl.⁶ ..................... H01L 23/48; H01L 29/41; H01L 29/52; H01L 29/60
[52] U.S. Cl. .................................. 257/693; 257/692; 257/697; 439/620
[58] Field of Search ............... 439/271, 487, 655, 651, 439/620; 357/693, 692, 697

[56] References Cited

U.S. PATENT DOCUMENTS

| | | |
|---|---|---|
| 4,239,319 | 12/1980 | Gladd et al. . |
| 4,675,718 | 6/1987 | Tsubokura et al. . |
| 4,985,310 | 1/1991 | Agarwala et al. .................. 428/620 |
| 5,108,300 | 4/1992 | Weber .................................. 439/620 |

FOREIGN PATENT DOCUMENTS 0294190  6/1988  European Pat. Off. .
0368115  10/1989  European Pat. Off. .

*Primary Examiner*—Andrew J. James
*Assistant Examiner*—S. V. Clark
*Attorney, Agent, or Firm*—Robert Groover

[57] ABSTRACT

A packaging structure is disclosed for a semiconductor device, having a body configured to include at least one part provided with contact terminals and shaped to form a connector member for direct coupling to a standard connector member from an external circuit. A connector assembly is also disclosed which is fully sealed from moisture and comprises the packaging structure.

25 Claims, 1 Drawing Sheet

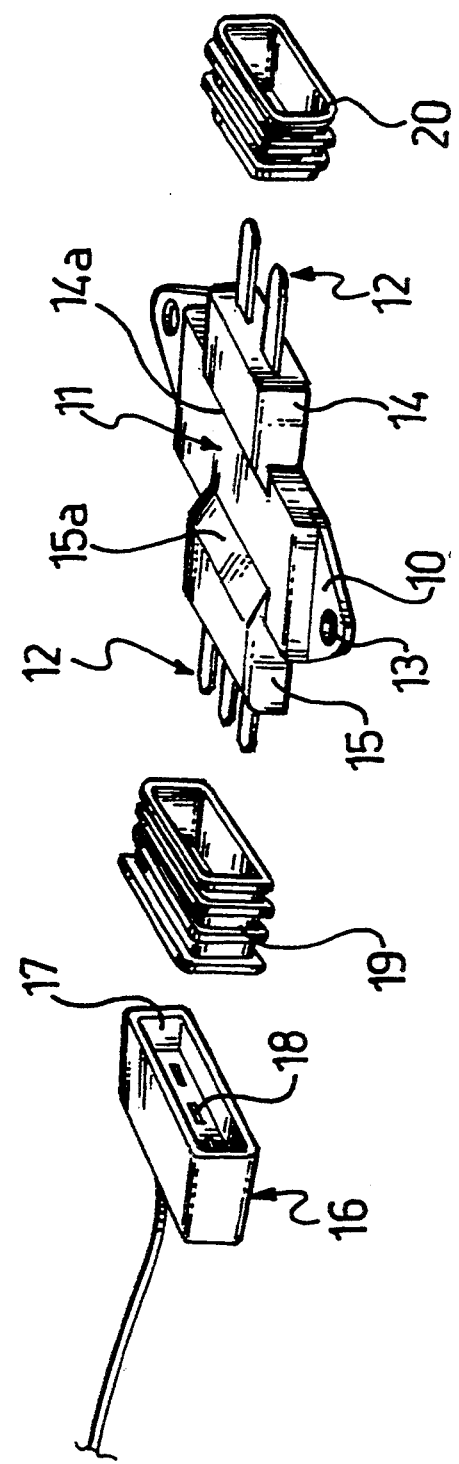

SEMICONDUCTOR DEVICE PACKAGE WITH SHAPED PARTS FOR DIRECT COUPLING TO STANDARD CONNECTORS

DESCRIPTION

This invention relates to electronic semiconductor devices, and more particularly to a packaging structure for a device of this kind which can be used to advantage in the automobile field.

Conventional electric systems equipping quality motor vehicles use, for connecting power supply cables to electric loads of the vehicle (such as lighting and indicating lamps, windshield wiper motors, etc.) connectors which are specially designed to be sealed from moisture as a safeguarding against loss of efficiency due to corrosion. These connectors have met with widespread acceptance by virtue of their beneficial features and have grown to be a "standard".

To operate the various electric loads of a motor vehicle, electronic switches have been extensively used which are controlled by coded signals from a central unit. In practice, each electric load has an electronic semiconductor device associated therewith, which includes a power output stage connected to drive the electric load, and a signal processing input stage, which activates the output stage to which power the load if the correct coded signal (allocated to the associated electric load) is received thereto.

Electronic devices of this kind are usually assembled in a single package, such as the one shown and described in Patent Application No. MI91A001180 filed on Apr. 30, 1991 by SGS Thomson Microelectronics S.r.l., which is hereby incorporated by reference. Such a package includes a small metallic plate performing support and heat dissipation functions, and a small polymer block whence the terminals are led out and which encloses the metallic plate so as to leave a major surface thereof exposed. In general, there are five terminals provided, namely two terminals for connection to the poles of the vehicle battery, one terminal for control signal transmission, and two terminals for connection to the electric load.

Electric systems employing such electronic devices have a larger number of electric connections per load than conventional electric systems, and in particular, cannot accept standard connectors because of the need for an interfacing element (namely the active switch) between the power supply circuit and the load.

Accordingly, the electric connections must be obtained with specially designed connectors to suit the peculiar structure of the electronic device, or alternatively, where the latter is provided with "fast-on" blade terminals with individual cables carrying female connection members of the "fast-on" type on their ends.

However, such custom connectors tend to be expensive because they do not partake in the benefit from the very large volume production of standard connectors, and "fast-on" connectors are not tightly sealed.

It is the main object of this invention to provide a semiconductor device package which can suit the above-described application and accept standard sealed connectors.

This object is achieved, according to the invention, by a package of an electronic semiconductor device comprising a body and terminating connector for connection to an external electric circuit, said external electric circuit including at least one connector member having predetermined shape and dimensions, wherein said body has at least one shaped part which includes some of said terminating connector, said shaped part and associated connectors having shapes, dimensions and layouts selected to form a complementary connector member of the connector member from the external electric circuit.

It is another object of the invention to provide a connector assembly with semiconductor electronic device which is protected against moisture.

The invention will be more clearly understood from the following detailed description of an exemplary, (and in no way limiting) embodiment thereof, to be read in conjunction with the accompanying drawings, in which a single Figure shows a pictorial view of a package according to the invention and a standard connection member for use in combination with the package.

As shown in the drawing, the package of this invention comprises a metallic plate, e.g. a copper plate, indicated at 10, which performs support and heat dissipation functions; a body 11 of a polymer material, such as a thermosetting epoxy resin, joined to the plate; and five terminals of the blade terminal type, indicated at 12, which are intended for connecting the electronic device to an external electric circuit.

The plate 10 has two through-holes 13 for fastening the device to a large size heat sink.

The polymer body 11 is formed by a conventional process step of injecting an epoxy resin in the liquid state into a purposely provided mold, wherein the plate has been placed already, followed by a curing step. It encloses the active components of the device, basically consisting of one or more chips of a semiconductor material, mounted on the metallic plate, some portions of the contact terminals, and the electric leads joining the chips together and to the rheophores; all this may be as disclosed, for example, in the above-referenced Application.

According to the invention, the structure containing the device comprises two parts 14 and 15 projecting from two opposite sides of the body 11 and being shaped to have substantially the forms of parallelepipeds with bevelled transverse corner edges to the body. These shaped parts have a coplanar surface with the outward face of plate 10 and the opposite surface merged into the remainder of body 11 through a ramp surface at 14a and 15a, respectively. Two of the contact terminals 12 project from shaped part 14, and the three others project from shaped part 15.

The two parts 14 and 15, with the associated rheophores, constitute male connector members adapted to fit into complementary connector members for connecting the electronic semiconductor device to an external circuit. Where the device is a controlled electronic switch, connector member 14 would have to be connected to a load, and connector member 15 to two leads taken to the battery poles, and to a lead taken to the central control unit.

The shape and size of the parts 14 and 15, and the arrangement of the contact terminals 12 are selected to have the two connector members match standard female connectors exactly. Shown in the drawing figure is just one three-terminal female connector of the standard type for coupling to part 15 of the device. It comprises basically a block 16 of an insulating material in the form of a parallelepiped with a cavity 17 having a complementary shape of that of shaped part 15 and three female connection terminals 18 in the cavity's interior which are adapted to receive the three terminals 12 of part 15. A rubber tubular bellows seal 19 fits resiliently on part 15, at one end, and on connector member 16, at the other end, to provide a fully sealed connection. The connector member 16, the shaped part 15 of body 11 and the tubular seal 19 form together a sealed and compact connector assembly.

Likewise, shaped part 14 is adapted to fit in a two-pole female connector member of the same standard type, not shown, also provided with a seal 20 similar to seal 19. This connector may be advantageously incorporated to the supporting structure for the electric load to be powered.

In a modified embodiment of the invention, the two-pole shaped part 14 is configured to have the contact terminals recessed into the projecting part, whereby the structure of the connector member is a female one. This configuration may be used to advantage where the connector member incorporated to the load structure is a male one.

Notice that the package of this invention can be implemented at no additional cost with respect to a conventional semiconductor device package, since its single manufacturing requirement is that a suitably shaped mold be provided. Furthermore, the fully sealed connection of the connector assembly made up of body 11, connector members and seals 19 and 20, helps to guarantee for the electronic device's reliability and life. This is because the sealed connection prevents moisture from penetrating through the contact surfaces between the terminals 12 and the plastics body 11, which, as is known, is the weak point of plastics encapsulated semiconductor electronic devices.

While one embodiment of this invention has been described and illustrated, it will be appreciated that there is scope for variation and modification in various ways within the same inventive concept.

We claim:

1. An electronic device package, comprising:
    a metal plate;
    an electronic active semiconductor device mounted to said plate;
    a polymer body totally enclosing said device, and enclosing only part of said plate;
    a first plurality of contact terminals partially embedded in a first face of said body to define, in combination with said first face, a first predetermined standard geometry for harsh-environment electrical connectors,
        each said contact terminal being operatively electrically connected to a separate respective portion of said device;
    and a second plurality of contact terminals partially embedded in a second face of said body
        to define, in combination with said second face, a second predetermined standard geometry for harsh-environment electrical connectors,
        each said contact terminal being operatively electrically connected to a separate respective portion of said active semiconductor device;
    wherein said plate extends laterally away from said body to provide through holes in said plate for mounting.

2. The package of claim 1, wherein said first standard geometry is different from said second standard geometry.

3. The package of claim 1, wherein said electronic device comprises a power transistor and electronics which are connected to control said power transistor.

4. The package of claim 1, wherein said first terminals and said second terminals face in exactly opposite directions.

5. The package of claim 1, wherein said first terminals are parallel to said plate.

6. The package of claim 1, wherein said second terminals are parallel to said plate.

7. The package of claim 1, wherein said second face is normal to said plate.

8. The package of claim 1, wherein said first face is normal to said plate.

9. The package of claim 1, wherein said first plurality of terminals consists of exactly two terminals, and said second plurality of terminals consists of exactly three terminals.

10. The package of claim 1, wherein said first plurality of terminals protrude from said first face to define a male connector geometry.

11. The package of claim 1, wherein said first plurality of terminals are enclosed by openings in said first face to define a female connector geometry.

12. The package of claim 1, further comprising a respective substantially tubular elastomeric boot surrounding each said plurality of connectors.

13. The package of claim 1, wherein each said face extends from said body substantially in the form of a parallelepiped with bevelled corner edges.

14. An electronic device package, comprising:
    a metal plate including mounting holes;
    an electronic active semiconductor device mounted to said plate;
    a polymer body totally enclosing said device, and enclosing pan of said plate, but not covering said mounting holes;
    a first plurality of contact terminals partially embedded in a first face of said body to define, in combination with said first face, a first predetermined standard geometry for harsh-environment electrical connectors,
        each said contact terminal being operatively electrically connected to a separate respective portion of said device; and
    a second plurality of contact terminals partially embedded in a second face of said body to define, in combination with said second face, a second predetermined standard geometry for harsh-environment electrical connectors,
        each said contact terminal being operatively electrically connected to a separate respective portion of said device; and
    a respective substantially tubular elastomeric boot surrounding each said plurality of contact terminals.

15. The package of claim 14, wherein said first standard geometry is different from said second standard geometry.

16. The package of claim 14, wherein said electronic device comprises a power transistor and electronics which are connected to control said power transistor.

17. The package of claim 14, wherein said first terminals and said second terminals face in exactly opposite directions.

18. The package of claim 14, wherein said first terminals are parallel to said plate.

19. The package of claim 14, wherein said second terminals are parallel to said plate.

20. The package of claim 14, wherein said second face is normal to said plate.

21. The package of claim 14, wherein said first face is normal to said plate.

22. The package of claim 14, wherein said first plurality of terminals consists of exactly two terminals, and said second plurality of terminals consists of exactly three terminals.

23. The package of claim 14, wherein said first plurality of terminals protrude from said first face to define a male connector geometry.

24. The package of claim 14, wherein said first plurality of terminals are enclosed by openings in said first face to define a female connector geometry.

25. The package of claim 14, wherein each said face extends from said body substantially in the form of a parallelepiped with bevelled corner edges.

* * * * *